United States Patent
Kataoka et al.

(10) Patent No.: US 10,319,985 B2
(45) Date of Patent: Jun. 11, 2019

(54) LITHIUM LANTHANUM ZIRCONIUM TANTALUM OXIDE GARNET CRYSTAL AND ALL-SOLID-STATE LITHIUM ION SECONDARY BATTERY

(71) Applicant: NATIONAL INSTITUTE OF ADVANCED INDUSTRIAL SCIENCE AND TECHNOLOGY, Tokyo (JP)

(72) Inventors: Kunimitsu Kataoka, Tsukuba (JP); Junji Akimoto, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 62 days.

(21) Appl. No.: 15/522,654

(22) PCT Filed: Oct. 23, 2015

(86) PCT No.: PCT/JP2015/079970
§ 371 (c)(1),
(2) Date: Apr. 27, 2017

(87) PCT Pub. No.: WO2016/068040
PCT Pub. Date: May 6, 2016

(65) Prior Publication Data
US 2017/0324079 A1    Nov. 9, 2017

(30) Foreign Application Priority Data
Oct. 27, 2014  (JP) ................................ 2014-218148

(51) Int. Cl.
*H01B 1/06* (2006.01)
*H01B 1/08* (2006.01)
(Continued)

(52) U.S. Cl.
CPC ............ *H01M 4/131* (2013.01); *C01G 35/00* (2013.01); *C01G 35/006* (2013.01); *C30B 29/22* (2013.01);
(Continued)

(58) Field of Classification Search
CPC .. H01M 10/052; H01M 10/0562; H01B 1/06; H01B 1/08; C01G 35/00; C01G 35/006; C30B 29/22
(Continued)

(56) References Cited

U.S. PATENT DOCUMENTS

| | | | | |
|---|---|---|---|---|
| 2011/0053002 A1* | 3/2011 | Yamamura | ........... | C01G 33/006 429/322 |
| 2014/0295287 A1* | 10/2014 | Eisele | .................. | C01G 25/006 429/319 |
| 2015/0024292 A1* | 1/2015 | Yamada | ................ | H01M 12/08 429/405 |

FOREIGN PATENT DOCUMENTS

| | | | | |
|---|---|---|---|---|
| JP | 2011073962 A | * | 4/2011 | ........... C01G 33/006 |
| JP | 2011195372 | | 10/2011 | |

(Continued)

OTHER PUBLICATIONS

Bsuchmann et al., Lithium metal electrode kinetics and ionic conductivity of the solid lithium ion conductors "Li7La3Zr2O12" and Li7-xLa3Zr2-xTaxO12 with garnet-type structure, Jan. 2012, Journal of Power Sources, 206, 236-244 (Year: 2012).*

(Continued)

*Primary Examiner* — Sean P Cullen
(74) *Attorney, Agent, or Firm* — Studebaker & Brackett PC

(57) ABSTRACT

There are provided a lithium-containing garnet crystal high in density and ionic conductivity, and an all-solid-state lithium ion secondary battery using the lithium-containing garnet crystal. The lithium-containing garnet crystal has a (Continued)

chemical composition represented by $Li_{7-x}La_3Zr_{2-x}Ta_xO_{12}$ ($0.2 \leq x \leq 1$), and has a relative density of 99% or higher, belongs to a cubic system, and has a garnet-related structure. The lithium-containing garnet crystal has a lithium ion conductivity of $1.0 \times 10^{-3}$ S/cm or higher. Further, this solid electrolyte material has a lattice constant a of 1.28 nm $\leq a \leq$ 1.30 nm, and lithium ions occupy 96h-sites in the crystal structure. The all-solid-state lithium ion secondary battery has a positive electrode, a negative electrode and a solid electrolyte, and the solid electrolyte is constituted of the lithium-containing garnet crystal according to the present invention.

10 Claims, 4 Drawing Sheets

(51) Int. Cl.

| | | |
|---|---|---|
| *C01G 35/00* | (2006.01) | |
| *C30B 29/22* | (2006.01) | |
| *H01B 13/00* | (2006.01) | |
| *H01M 4/131* | (2010.01) | |
| *H01M 10/052* | (2010.01) | |
| *H01M 10/0525* | (2010.01) | |
| *H01M 10/0562* | (2010.01) | |

(52) U.S. Cl.
CPC ............... *H01B 1/06* (2013.01); *H01B 1/08* (2013.01); *H01B 13/00* (2013.01); *H01M 10/052* (2013.01); *H01M 10/0525* (2013.01); *H01M 10/0562* (2013.01); *Y02E 60/122* (2013.01); *Y02P 70/54* (2015.11); *Y02T 10/7011* (2013.01)

(58) Field of Classification Search
USPC ........................................................ 429/322
See application file for complete search history.

(56) References Cited

FOREIGN PATENT DOCUMENTS

| JP | 2011195373 | 10/2011 | |
|---|---|---|---|
| WO | WO-2013010692 A1 * | 1/2013 | ............ C01G 25/006 |
| WO | WO-2013161516 A1 * | 10/2013 | ............ H01M 12/08 |

OTHER PUBLICATIONS

Li et al., High lithium ion conduction in garnet-type Li6La3ZrTaO12, Aug. 2011, Electrochemistry Communications, 13, 1289-1292 (Year: 2011).*
Li et al. Optimizing Li+ conductivity in a garnet framework, 2012, Journal of Materials Chemistry, 22, 15357-15361 (Year: 2012).*
Li et al., High lithium ion conduction in garnet-type Li6La3ZrTaO12, Dec. 2011, Electrochemistry Communications, 13, 1289-1292 (Year: 2011).*
Wang et al., High Ionic Conductivity Lithium Garnet Oxides of Li7-xLa3Zr2-xTaxO12 Compositions, Feb. 2012, Electrochemical and Solid-state Letters, 15, A68-A71 (Year: 2012).*
English Machine Text Translation and Abstract of Japanese Patent Application No. 2011195373 A, Published on Oct. 6, 2011, National Institute of Advanced Industrial Science & Technology; 19 pages.
English Machine Text Translation and Abstract of Japanese Patent Application No. 2011195372 A, Published on Oct. 6, 2011, National Institute of Advanced Industrial Science & Technology; 17 pages.
Awake, J., et al., "Synthesis and structure analysis of tetragonal Li7La3Zr2O12 with the garnet-related type structure," National Institute of Advanced Industrial Science and Technology (AIST), Journal of Solid State Chemistry, vol. 182 (2009); pp. 2046-2052.
Allen, J. L., et al., "Effect of substitution (Ta, Al, Ga) on the conductivity of Li7La3Zr2O12," Elsevier B.V., Journal of Power Sources, Published on May 15, 2012, vol. 206, ISSN.378-7753; pp. 315-319.
Li, Yiqiu et al., "Densification and ionic-conduction improvement of lithium garnet solid electrolytes by flowing oxygen sintering," Elsevier B.V., Journal of Power Sources, Published on Feb. 15, 2014, vol. 248, ISSN0378-7753; pp. 642-646.

* cited by examiner

LITHIUM LANTHANUM ZIRCONIUM TANTALUM OXIDE GARNET CRYSTAL AND ALL-SOLID-STATE LITHIUM ION SECONDARY BATTERY

CROSS REFERENCE TO RELATED APPLICATIONS

This application is the U.S. National Phase Application under 35 U.S.C. 371 of International Application No. PCT/JP2015/079970, entitled "LITHIUM-CONTAINING GARNET CRYSTAL AND ALL-SOLID-STATE LITHIUM ION SECONDARY BATTERY," filed on 23 Oct. 2015, which claims priority to Japanese Patent Application JP 2014-218148, filed on 27 Oct. 2014, which the contents of these applications are incorporated by reference herein in their entireties.

TECHNICAL FIELD

The present invention relates to a lithium-containing garnet crystal high in density and ionic conductivity, and an all-solid-state lithium ion secondary battery using the lithium-containing garnet crystal.

BACKGROUND ART

Lithium ion secondary batteries are broadly used in small-size information devices such as cell phones and laptop computers because of higher energy density compared to those secondary batteries such as nickel-cadmium batteries and nickel-hydrogen batteries and availability at a high potential. Further, in recent years, since the size and weight reduction of lithium ion secondary batteries is easily achieved, demands therefor have arisen as secondary batteries for hybrid cars and electric cars. Research and development has been carried out for all-solid-state lithium ion secondary batteries using no inflammable electrolyte solution in consideration of the safety. Solid electrolytes to be used for all-solid-state lithium ion secondary batteries are demanded to have a high ionic conductivity.

It has been reported that materials having a cubic garnet-related structure have a high ionic conductivity (see, for example, Patent Literature 1), and research and development of materials having this structure is being advanced. In particularly, a material having a chemical composition represented by $Li_{7-x}La_3Zr_{2-x}Ta_xO_{12}$ is reported to have a high ionic conductivity nearly at x=0.5. Since the grain boundary resistance and the interface resistance need to be reduced to the utmost in order to realize a high ionic conductivity, a solid material being a formed body having a high density is desirable. Since a solid material being a formed body having a high density is capable of preventing short circuit between positive and negative electrodes in the charge and discharge process and can be turned into a thin film piece, the solid material gives a possibility to the future size reduction of all-solid-state lithium ion secondary batteries. It is known, however, that these materials having a cubic garnet-related structure are sintering-resistant and the fabrication of high-density formed bodies is difficult.

CITATION LIST

Patent Literature

Patent Literature 1: Japanese Patent Laid-Open No. 2011-195373

Non Patent Literature

Non Patent Literature 1: J. Awaka, N. Kijima, H. Hayakawa, J. Akimoto, Journal of Solid State Chemistry, 182, pp. 2046-2052 (2009)

SUMMARY OF INVENTION

Technical Problem

The present invention has been achieved in consideration of such a situation, and has an object to provide a high-density lithium-containing garnet crystal and a method for producing the same, and an all-solid-state lithium ion secondary battery using the lithium-containing garnet crystal as its solid electrolyte.

Solution to Problem

The present inventors have considered that by devising a method for producing crystals, a high-density $Li_{7-x}La_3Zr_{2-x}Ta_xO_{12}$ crystal having no grain boundaries present therein can be obtained to thereby solve the above problem. Then, as a result of exhaustive studies on a method for producing a $Li_{7-x}La_3Zr_{2-x}Ta_xO_{12}$ crystal in which raw materials are melted at a high temperature and cooled, it has been confirmed that a $Li_{7-x}La_3Zr_{2-x}Ta_xO_{12}$ crystal having a high-density garnet-related structure can be grown, and the $Li_{7-x}La_3Zr_{2-x}Ta_xO_{12}$ crystal can be mechanically turned into of thin film pieces; and these findings have led to the completion of the present invention.

That is, the present inventors have found that a polycrystalline $Li_{(7-x)y}La_3Zr_{2-x}Ta_xO_{12}$ ($0.2 \leq x \leq 1$, $1 < y \leq 2$) is formed into a rod shape, and thereafter, the polycrystal is melted and quenched by an FZ method using infrared condensing heating to be thereby able to fabricate a rod of a high-density $Li_{7-x}La_3Zr_{2-x}Ta_xO_{12}$ ($0.2 \leq x \leq 1$) crystal. Then, it has also been found besides that since the high-density rod has a high strength, the rod can be cut easily by a diamond cutter or the like, and thin film pieces of the $Li_{7-x}La_3Zr_{2-x}Ta_xO_{12}$ crystal of about 0.1 mm in thickness can be fabricated by the cutting.

The lithium-containing garnet crystal according to the present invention, for example, the crystal having a chemical composition represented by $Li_{7-x}La_3Zr_{2-x}Ta_xO_{12}$ ($0.2 \leq x \leq 1$), has a relative density of 99% or higher, belongs to a cubic system, and has a garnet-related structure. The method for producing a lithium-containing garnet crystal according to the present invention has a step of melting at least a part of a raw material having a chemical composition represented by $Li_{(7-x)y}La_3Zr_{2-x}Ta_xO_{12}$ ($0.2 \leq x \leq 1$, $1 < y \leq 2$) to thereby form a melted zone, and moving the melted zone at a moving speed of 8 mm/h or higher. The all-solid-state lithium ion secondary battery according to the present invention has a positive electrode, a negative electrode and a solid electrolyte, wherein the solid electrolyte is constituted of the lithium-containing garnet crystal according to the present invention.

Advantageous Effects of Invention

According to the present invention, there can be provided a solid electrolyte material high in density and ionic conductivity, and an all-solid-state lithium ion secondary battery using the solid electrolyte material.

DESCRIPTION OF EMBODIMENTS

Hereinafter, the lithium-containing garnet crystal, the method for producing a lithium-containing garnet crystal and the all-solid-state lithium ion secondary battery according to the present invention will be described in detail by way of embodiments and Examples. Here, duplicated descriptions will suitably be omitted.

A lithium-containing garnet crystal according to an embodiment of the present invention has a relative density of 99% or higher, belongs to a cubic system, and has a garnet-related structure. The relative density is calculated by measuring the outer shape of a fabricated thin film piece to calculate its apparent volume, and dividing an apparent density calculated from a measured mass by a true density obtained from a single crystal X-ray structure analysis result. It is better that the relative density of the lithium-containing garnet crystal according to the present embodiment be higher. Here, it is not needed that all the crystal domains of the lithium-containing garnet crystal according to the present embodiment point to the same direction.

When the proportion of crystal domains of a lithium-containing garnet crystal arranged in the same direction is high in the X-ray diffraction measurement using its single crystal, diffraction spots are observed as clear points. In the case of a specimen of a cubic $Li_{7-x}La_3Zr_{2-x}Ta_xO_{12}$ crystal in which the directions of crystal domains are not uniformly arranged, diffraction spots become complicated in some cases, and diffractions from various domains are superimposed to thereby make diffraction spots into nearly ring-shapes in some cases. This specimen is fabricated by moving a melted zone at 10 mm/h in an FZ method. Hence, the cooling speed of the melted zone is raised and the crystal cannot always be grown so that the directions of the crystal domains are uniformly arranged in the specimen.

Figure 4:
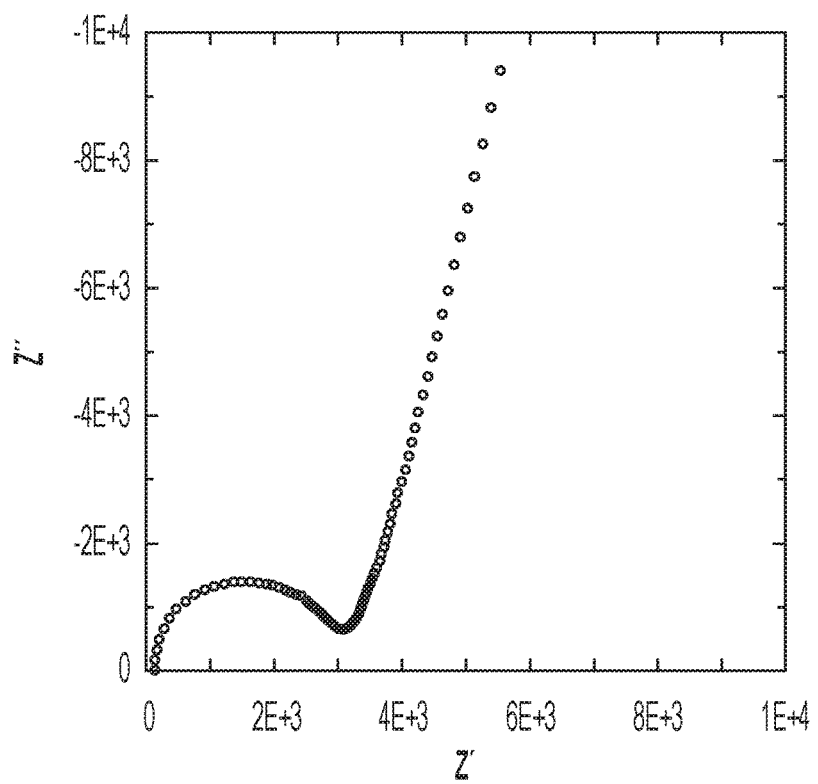
FIG. 4 is a Nyquist plot of the $Li_{6.4}La_3Zr_{1.4}Ta_{0.6}O_{12}$ single crystal of Example 1.

Since it is difficult to raise the relative density of polycrystals, many voids in the polycrystals are reflected on measurement results in the alternating current impedance measurement. For example, in a reported polycrystal of $Li_7La_3Zr_2O_{12}$, the Nyquist plot by the alternating current impedance measurement indicates two resistance components of a resistance component by crystal grain boundaries and a resistance component by the material itself (see Non Patent Literature 1). By contrast, the Nyquist plot of the lithium-containing garnet crystal according to the present embodiment, as shown in FIG. 4 described later, does not indicate the resistance component by crystal grain boundaries, and indicates only the resistance component of the material itself. Further in the X-ray diffraction measurement, the neutron diffraction measurement or the electron diffraction measurement using a single crystal of the lithium-containing garnet crystal according to the present embodiment, diffraction spots emerge as ring shapes in the diffraction pattern in some cases.

As a result of exhaustive studies on a method of melting at a high temperature and cooling a mixed raw material containing excess lithium to the compositional ratio of a lithium-containing garnet crystal of a target, the present inventors have found that a $Li_{7-x}La_3Zr_{2-x}Ta_xO_{12}$ ($0.2 \leq x \leq 1$) single crystal belonging to a cubic system and having a garnet-related structure can be fabricated, and have confirmed that the single crystal can be mechanically turned into of thin film pieces; and these findings have led to the completion of the present invention. In the case where a single crystal belonging to a cubic system and having a garnet-related structure is grown by an FZ method, usually, a specimen rod is rotated at 20 rpm or less, and lowered at a lowering speed of about 2 mm/h. Under this condition, however, voids are generated in the $Li_{7-x}La_3Zr_{2-x}Ta_xO_{12}$ ($0.2 \leq x \leq 1$), and a high-density crystal cannot be fabricated.

In order to fabricate a crystal having no voids, while a rod-shape raw material is rotated at a rotating speed of 30 rpm or higher, a melted zone of the raw material is lowered at a moving speed of 8 mm/h or higher, and the melted zone is cooled at a high speed. An obtained rod of a high-density $Li_{7-x}La_3Zr_{2-x}Ta_xO_{12}$ ($0.2 \leq x \leq 1$) crystal, since having a high density, can be cut in any thickness by a diamond cutter or the like. Further the high-density $Li_{7-x}La_3Zr_{2-x}Ta_xO_{12}$ ($0.2 \leq x \leq 1$) crystal according to the present invention, in consideration that lithium volatilizes at high temperatures, can be produced by melting a mixed raw material in which the amount of lithium is made larger than the stoichiometric amount thereof in the chemical composition represented by $Li_{7-x}La_3Zr_{2-x}Ta_xO_{12}$ ($0.2 \leq x \leq 1$).

The chemical composition of the lithium-containing garnet crystal according to the present embodiment is represented by $Li_{7-x}La_3Zr_{2-x}Ta_xO_{12}$ ($0.2 \leq x \leq 1$). Further the lithium-containing garnet crystal according to the present embodiment is high in ionic conductivity. Specifically, a lithium-containing garnet crystal having a lithium ionic conductivity of $1.0 \times 10^{-3}$ S/cm or higher can be obtained. Further the lattice constant a of the lithium-containing garnet crystal according to the present embodiment is 1.28 nm $\leq a \leq$ 1.30 nm.

The lithium-containing garnet crystal according to the present embodiment satisfies at least one of the following (1) and (2). (1) The Nyquist plot by the alternating current impedance measurement indicates no resistance component by crystal grain boundaries and indicates only the resistance component of the material itself. (2) Diffraction spots emerge in the diffraction pattern in the X-ray diffraction measurement, the neutron diffraction measurement or the electron diffraction measurement using the single crystal. There may be the cases where the diffraction spots emerge only as spot shapes, or emerge as spot shapes and ring shapes.

The lithium-containing garnet crystal according to the present embodiment can be produced by melting at least a part of a raw material having a chemical composition represented by $Li_{(7-x)y}La_3Zr_{2-x}Ta_xO_{12}$ ($0.2 \leq x \leq 1$, $1 < y \leq 2$) to thereby form a melted zone, and moving the melted zone at a moving speed of 8 mm/h or higher. Specifically, the high-density $Li_{7-x}La_3Zr_{2-x}Ta_xO_{12}$ ($0.2 \leq x \leq 1$) crystal according to the present embodiment is grown by an FZ method, a Czochralski (CZ) method, a Bridgeman method, a pedestal method or the like.

According to the size, the shape and the like of a $Li_{7-x}La_3Zr_{2-x}Ta_xO_{12}$ ($0.2 \leq x \leq 1$) crystal to be produced, a suitable method may be selected from among these methods. By an FZ method, a $Li_{7-x}La_3Zr_{2-x}Ta_xO_{12}$ ($0.2 \leq x \leq 1$) crystal having a relative density of 100%, that is, a $Li_{7-x}La_3Zr_{2-x}Ta_xO_{12}$ ($0.2 \leq x \leq 1$) single crystal by nature can be produced. The $Li_{7-x}La_3Zr_{2-x}Ta_xO_{12}$ ($0.2 \leq x \leq 1$) crystal having a relative density of 100% is excellent particularly in the lithium ion conductivity.

In the case where the lithium-containing garnet crystal according to the present embodiment is produced by an FZ method, the crystal is grown by melting a rod-shape raw material while rotating the raw material in the plane perpendicular to the longitudinal direction at a rotating speed of 30 rpm or higher, and moving a melted zone to the longitudinal direction. By making the moving speed of the melted zone to be as high as 8 mm/h or higher, the decomposition of the raw material accompanying the volatilization of lithium can be avoided. It is preferable that the moving speed of the melted zone be 8 mm/h or higher and 19 mm/h or lower. Although lithium is about to volatile in the melted zone to thereby generate bubbles, by making the rotating speed of the rod-shape raw material to be as fast as 30 rpm or higher, the bubbles can be removed. It is preferable that the rotating speed of the raw material be 30 rpm or higher and 60 rpm or lower. It is preferable that the melting of the raw material and the movement of the melted zone be carried out in a dry air atmosphere. Thus, a $Li_{7-x}La_3Zr_{2-x}Ta_xO_{12}$ ($0.2 \leq x \leq 1$) crystal having a relative density of 99% or higher can be produced.

By taking as an example the growth of a $Li_{7-x}La_3Zr_{2-x}Ta_xO_{12}$ ($0.2 \leq x \leq 1$) crystal having a relative density of 99% or higher, belonging to a cubic system, and having a garnet-related structure, there will be described the method for producing the lithium-containing garnet crystal according to the present embodiment. First, a rod-shape raw material is fabricated as follows. First, in consideration that lithium volatilizes at high temperatures, a lithium compound, a lanthanum compound, a zirconium compound and a tantalum compound are weighed so that Li:La:Zr:Ta becomes a molar ratio of $(7-x)y:3:2-x:x$ ($1 < y \leq 2$).

The lithium compound is not especially limited as long as containing lithium, and includes oxides such as $Li_2O$, and carbonate salts such as $Li_2CO_3$. The lanthanum compound is not especially limited as long as containing lanthanum, and includes oxides such as $La_2O_3$, and hydroxides such as $La(OH)_3$. The zirconium compound is not especially limited as long as containing zirconium, and includes oxides such as $ZrO_2$, and chlorides such as $ZrCl_4$. The tantalum compound is not especially limited as long as containing tantalum, and includes oxides such as $Ta_2O_5$, and chlorides such as $TaCl_5$.

By using compounds selected from compounds containing two or more of lithium, lanthanum, zirconium and tantalum, the compounds may be weighed so that Li:La:Zr:Ta becomes a molar ratio of $(7-x)y:3:2-x:x$ ($1 < y < 2$). Such compounds containing two or more thereof include lanthanum zirconium oxides such as $La_2Zr_2O_7$, lanthanum tantalum oxides such as $LaTaO_4$, lithium tantalum oxides such as $LiTaO_3$, and lithium zirconium oxides such as $Li_2ZrO_3$.

Then, the each weighed compound is mixed. A mixing method is not especially limited as long as being capable of homogeneously mixing the each compound; and the mixing may be carried out, for example, in wet or in dry by using a mixing machine such as a mixer. Then, an obtained mixture is filled in a crucible with a lid, thereafter calcined at 600° C. to 900° C., preferably at 850° C., filled in a rubber tube or the like to make a rod shape thereof, and thereafter hydrostatically pressed and formed to thereby obtain a raw material powder. Here, it is more preferable if a raw material once calcined is again subjected to repeated crushing, mixing and firing.

Then, in order for the raw material powder to be easily formed, the obtained raw material powder is crushed to make the particle size fine. A crushing method is not especially limited as long as being capable of making the powder fine; and the crushing may be carried out in wet or in dry by using a crushing apparatus such as a planetary ball mill, a pot mill or a bead mill. Then, an obtained crushed material is filled in a rubber tube, and thereafter hydrostatically pressed and formed into a rod shape. Then, the obtained rod green body is fired at about 700° C. to 1,300° C., preferably at 800° C. to 1,150° C., for about 4 hours to thereby obtain a rod-shape raw material. At this time point, the chemical composition of the raw material is $Li_{(7-x)y}La_3Zr_{2-x}Ta_xO_{12}$ ($0.2 \leq x \leq 1$, $1 < y \leq 2$). Thus, a rod-shape raw material can be produced.

Then, the rod-shape raw material is melted in an infrared condensing heating furnace, and thereafter quenched to thereby produce a $Li_{7-x}La_3Zr_{2-x}Ta_xO_{12}$ ($0.2 \leq x \leq 1$) having a relative density of 99% or higher, belonging to a cubic system, and having a garnet-related structure. By this production method, a $Li_{7-x}La_3Zr_{2-x}Ta_xO_{12}$ ($0.2 \leq x \leq 1$) crystal having a length of 2 cm or longer can be obtained. Hence, thin film pieces having the same quality can easily be fabricated by cutting.

Further, when producing a high-density $Li_{7-x}La_3Zr_{2-x}Ta_xO_{12}$ ($0.2 \leq x \leq 1$) crystal by a CZ method, the production is carried out by the following procedure. First, a powdery raw material is put in a crucible, and heated and melted. Then, a seed crystal is dipped in the melt of the raw material, and pulled upwards while being rotated. It is conceivable that by making the moving speed of a melted zone, that is, the pulling-up speed of the seed crystal to be as fast as 8 mm/h or higher, the volatilization of lithium is suppressed and a high-density $Li_{7-x}La_3Zr_{2-x}Ta_xO_{12}$ ($0.2 \leq x \leq 1$) crystal can be obtained.

Further, the high-density $Li_{7-x}La_3Zr_{2-x}Ta_xO_{12}$ ($0.2 \leq x \leq 1$) crystal according to the present invention can be used for a solid electrolyte of an all-solid-state lithium ion secondary battery due to its excellent lithium ion conductivity. That is, the all-solid-state lithium ion secondary battery according to the present invention has a positive electrode, a negative electrode and a solid electrolyte, and the solid electrolyte is constituted of the lithium-containing garnet crystal according to the present invention. Hereinafter, the present invention will be described more specifically by way of Examples, but the present invention is not any more limited to these Examples.

EXAMPLES

Example 1: Production of a $Li_{6.4}La_3Zr_{1.4}Ta_{0.6}O_{12}$ Crystal by an FZ Method (Mixing of Raw Materials)

First, 9.7122 g of lithium carbonate $Li_2CO_3$ (manufactured by Rare Metallic Co., Ltd., purity: 99.99%), 16.4710 g of lanthanum oxide $La_2O_3$ (manufactured by Rare Metallic Co., Ltd., purity: 99.99%), 6.2293 g of zirconium oxide $ZrO_2$ (manufactured by Rare Metallic Co., Ltd., purity: 99.99%), and 3.7234 g of tantalum oxide $Ta_2O_5$ (manufactured by Rare Metallic Co., Ltd., purity: 99.99%) were put in an agate mortar, and homogeneously mixed by a wet method using ethanol. Here, the lanthanum oxide used was one previously calcined at 900° C. The molar ratio of the metals Li:La:Zr:Ta of this mixture was such that lithium was excess by 20% by mol to the stoichiometric ratio of $Li_{6.5}La_3Zr_{1.5}Ta_{0.5}O_{12}$ being a target substance. That is, the mixture has a chemical composition equivalent to $Li_{7.8}La_3Zr_{1.5}Ta_{0.5}O_{12}$.

Then, 36.135 g of the mixture was filled in an alumina crucible with a lid (manufactured by Nikkato Corp., C3 type). Then, the crucible was put in a box-type electric furnace (manufactured by Yamato Scientific Co., Ltd., FP100 type), and the mixture was calcined at 850° C. for 6 hours to thereby obtain a powder. Then, the obtained powder was crushed. That is, 36 g of the obtained powder, 50 g of zirconia balls of 5 mm in diameter, and 14 mL of ion-exchange water were filled in a zirconia crushing vessel of 45 mL in volume, and crushed by using a planetary ball mill (manufactured by Fritsch GmbH, type: P-6) at a revolution frequency of 200 rpm for 300 min in total of the revolution. A powder after the crushing was dried at 100° C. for 24 hours, and classified by using a sieve of 250 μm in sieve opening.

(Fabrication of a Rod-Shape Raw Material)

By using the powder having passed through the sieve in the above step, a rod-shape raw material was fabricated by the following procedure. First, 23.927 g of the powder was filled in a rubber mold, and deaerated. Then, the mold was put in water in the closed state thereof, and maintained at 40 MPa for 5 min. Then, after the pressure of the water was lowered, a green body was taken out from the mold. The green body had a cylindrical shape of 1.2 cm in diameter and 8.3 cm in height. Then, the cylindrical green body was fired at 1,150° C. for 4 hours by using a box-type electric furnace (manufactured by Denken-Highdental Co., Ltd., model number: KDF009). A taken-out formed body had a cylindrical shape of 0.97 cm in diameter and 6.8 cm in height.

(Growth of a $Li_{6.4}La_3Zr_{1.4}Ta_{0.6}O_{12}$ Crystal)

Figure 1:
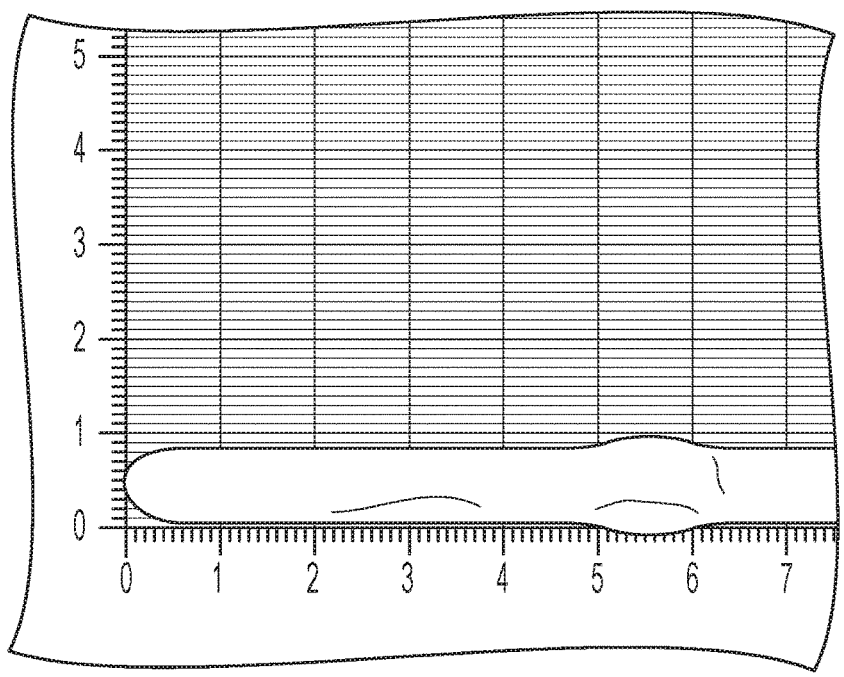
FIG. 1 is a photograph of an appearance of a $Li_{6.4}La_3Zr_{1.4}Ta_{0.6}O_{12}$ single crystal of Example 1.

First, the rod-shape raw material obtained in the above step was installed in an infrared condensing heating furnace using four mirror system (FZ furnace) equipped with halogen lamps of 1 kW (manufactured by Crystal Systems Corp., FT-T-10000H type), and the furnace interior atmosphere was made to be a dry air one. Then, the rod-shape raw material was heated at an output of 30.3% while being rotated at 40 rpm in the plane perpendicular to the longitudinal direction. A while later, a part of the polycrystal specimen was melted and a melted zone was formed. Then, by lowering an installing pedestal of the rod-shape raw material at a moving speed of 19 mm/h, a high-density $Li_{6.4}La_3Zr_{1.4}Ta_{0.6}O_{12}$ crystal (hereinafter, referred to as "Specimen 1" in some cases) was grown. Here, the chemical composition of Specimen 1 was analyzed by an X-ray crystal structure analysis. The appearance of Specimen 1 is shown in FIG. 1. As shown in FIG. 1, a high-density $Li_{6.4}La_3Zr_{1.4}Ta_{0.6}O_{12}$ crystal having a length of 6 cm was able to be fabricated.

(Evaluation of the High-Density $Li_{6.4}La_3Zr_{1.4}Ta_{0.6}O_{12}$ Crystal)

Figure 2:
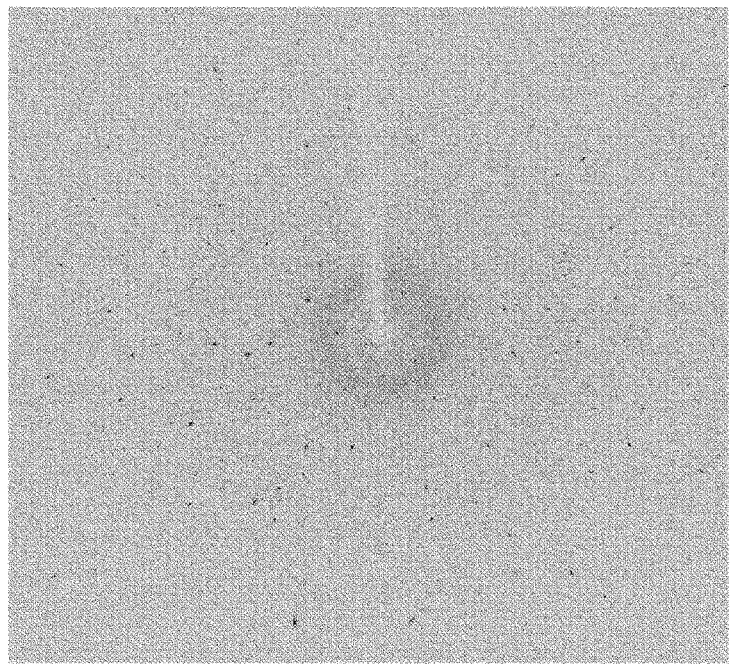
FIG. 2 is an X-ray diffraction pattern of the $Li_{6.4}La_3Zr_{1.4}Ta_{0.6}O_{12}$ single crystal of Example 1.

The structure of Specimen 1 was examined by using a single crystal X-ray diffractometer having a two-dimensional IP detector and a scintillation counter as a detector (manufactured by Rigaku Corp., R-AXIS RAPID-II, AFC-7S). An X-ray diffraction pattern of Specimen 1 is shown in FIG. 2. As shown in FIG. 2, clear diffraction spots could be measured. Further, diffraction intensity data of Specimen 1 were collected and the crystal structure was examined by a crystal structure analysis program Jana2006, and it was then found that Specimen 1 belonged to a cubic system. Specimen 1 was cut by a diamond cutter to thereby fabricate four thin film pieces of 0.1 mm in thickness, and the relative densities thereof were calculated by the above-mentioned method. As a result, these relative densities were 99.2%, 99.7%, 99.9% and 100%.

Figure 3:
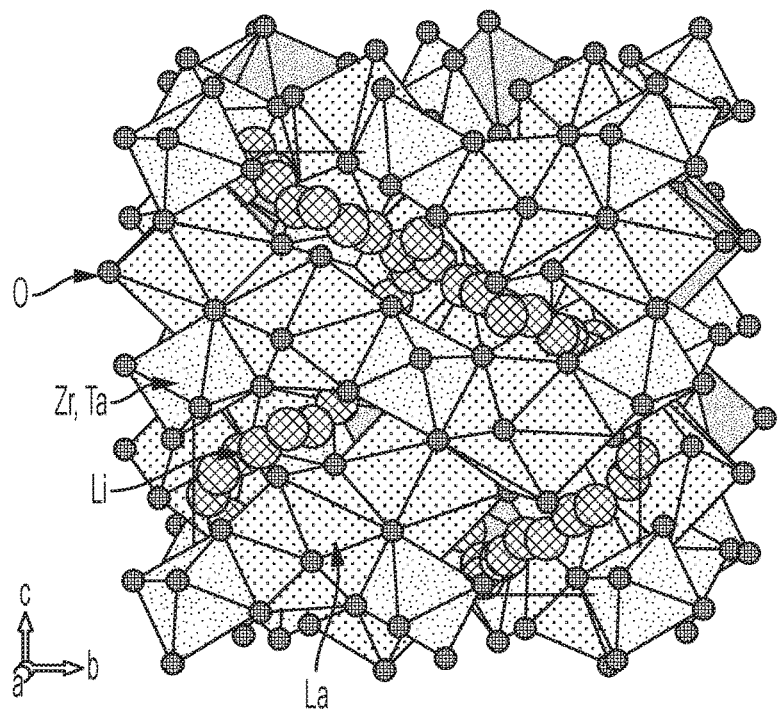
FIG. 3 is a schematic view illustrating a garnet-related structure of the $Li_{6.4}La_3Zr_{1.4}Ta_{0.6}O_{12}$ single crystal of Example 1.

FIG. 3 schematically illustrates the structure of Specimen 1. Although the cubic garnet-related structure $Li_7La_3Zr_2Ta_xO_{12}$ having been so far reported have two kinds of lithium ion sites (24d-site, 96h-site) in their crystal structure, Specimen 1 had two sites of one kind of lithium ion site (two 96h-sites) in its crystal structure. That is, in Specimen 1, lithium was present on ion sites, 96h-sites, of one kind. Since the R factor indicating the reliability of the crystal structure analysis was 5.38%, the result of the crystal structure analysis could be said to be reasonable.

Further with respect to the arrangement of the lithium ions, the distance among the lithium ions was nearest among those in all cubic garnet-related structures having so far been reported. Hence, it is conceivable that the lithium ion conductivity of Specimen 1 was higher than those of other cubic garnet-related structure compounds. Specimen 1 was cut and a thin film piece of 1.0 cm in diameter and about 0.16 cm in thickness was fabricated. On each side of the front side and the rear side of the thin film piece, an electrode was formed by sputtering gold whose base was a square of 0.18 cm in one side and whose thickness was 40 nm. This specimen was subjected to an alternating current impedance measurement (measurement instrument: Solarton, 1260) in a nitrogen atmosphere at 25° C. to thereby measure an impedance of Specimen 1. A Nyquist plot at this time is shown in FIG. 4. The lithium ion conductivity was calculated from the Nyquist plot shown in FIG. 4, and was $3.0\times10^{-3}$ S/cm.

Figure 5:
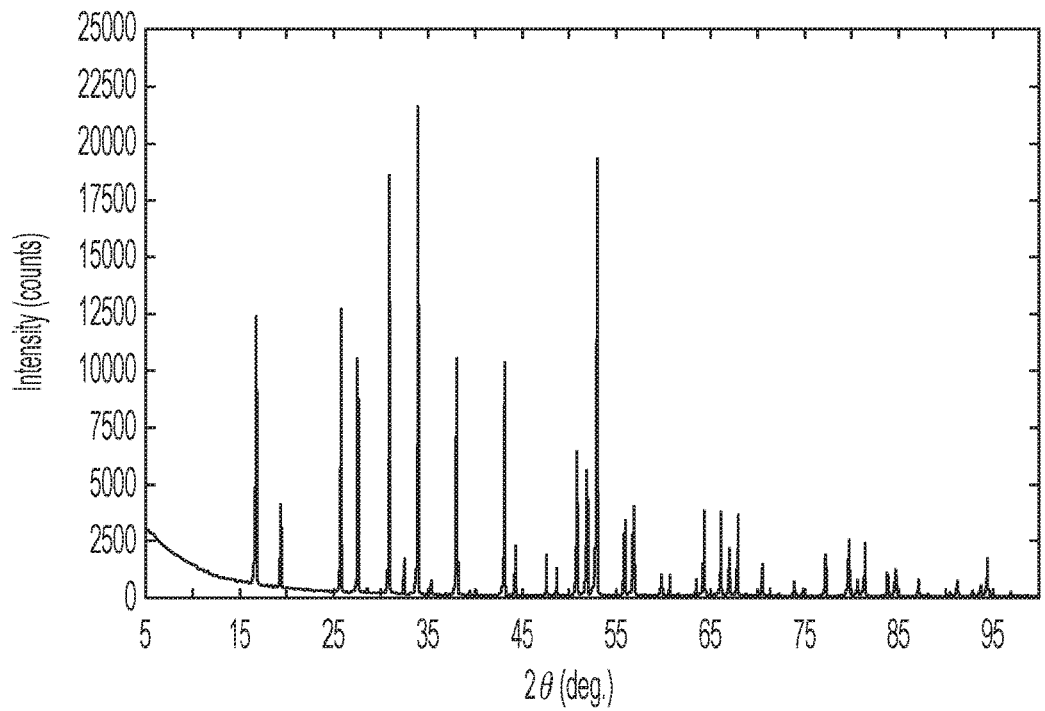
FIG. 5 is a powder X-ray diffraction pattern of the $Li_{6.4}La_3Zr_{1.4}Ta_{0.6}O_{12}$ single crystal of Example 1.

The lattice constant a of Specimen 1 was determined by the method of least squares by using reflections observed by a single crystal X-ray diffraction measurement, and was a=1.2920 nm±0.0003 nm. It was found from this lattice constant that Specimen 1 was a lithium composite oxide having a garnet-related structure. Specimen 1 was crushed and subjected to a powder X-ray diffraction measurement, and the result thereof is shown in FIG. 5. The powder X-ray diffraction measurement pattern of Specimen 1 was the same as those of cubic garnet-related-structure $Li_{7-x}La_3Zr_{2-x}Ta_xO_{12}$ ($0.2 \leq x \leq 1$) having so far been reported. The lattice constant a calculated from the result of a powder X-ray structure refinement was 1.29494 nm±0.00001 nm. Combining the results of the single crystal X-ray diffraction measurement and the powder X-ray structure refinement, the lattice constant a of Specimen 1 was 1.2917 nm a 1.29495 nm.

Example 2: Production of a $Li_{6.72}La_3Zr_{1.72}Ta_{0.28}O_{12}$ Crystal by an FZ Method A lithium-containing garnet crystal was produced and evaluated as in Example 1, except for mixing lithium carbonate $Li_2CO_3$, lanthanum oxide $La_2O_3$, zirconium oxide $ZrO_2$, and tantalum oxide $Ta_2O_5$ so that the molar ratio of the metals Li:La:Ta:Zr became 8.16:3.0:1.8:0.2, that is, so that $Li_{(7-x)y}La_3Zr_{2-x}Ta_xO_{12}$ of the raw material became x=0.2 and y=1.2. The obtained crystal was a lithium composite oxide having a cubic garnet-related structure. The lattice constant a of this crystal was 1.29448±0.00007 nm, and the chemical composition thereof was $Li_{6.72}La_3Zr_{1.72}Ta_{0.28}O_{12}$.

Example 3: Production of a $Li_{5.92}La_3Zr_{0.92}Ta_{1.08}O_{12}$ Crystal by an FZ Method A lithium-containing garnet crystal was produced and evaluated as in Example 1, except for mixing lithium carbonate $Li_2CO_3$, lanthanum oxide $La_2O_3$, zirconium oxide $ZrO_2$, and tantalum oxide $Ta_2O_5$ so that the molar ratio of the metals Li:La:Ta:Zr became 7.2:3.0:1.0:1.0, that is, so that $Li_{(7-x)y}La_3Zr_{2-x}Ta_xO_{12}$ of the raw material became x=1.0 and y=1.2. The obtained crystal was a lithium composite oxide having a cubic garnet-related structure. The lattice constant a of this crystal was 1.29041±0.00003 nm, and the chemical composition thereof was $Li_{5.92}La_3Zr_{0.92}Ta_{1.08}O_{12}$.

Example 4: Production of a $Li_{7-x}La_3Zr_{2-x}Ta_xO_{12}$ Crystal by a CZ Method First, a raw material mixed powder was fabricated as in Example 1. Then, 45 g of the obtained mixed powder was filled in a cylindrical iridium vessel of 2.6 cm in inner diameter and 2.8 cm in depth. Then, the iridium vessel was installed in a single crystal pulling-up furnace equipped with a high-frequency induction heating function (CZ furnace) (manufactured by Techno Search Corp., TCH-3). Then, a tungsten rod of 0.8 mm in length was installed on a pulling-up section, and the CZ furnace interior was made to be in a dry nitrogen atmosphere. Then, the high-frequency output was gradually raised and the iridium vessel was continuously heated at an output of 79.2%. A while later, the raw material mixed powder filled in the iridium vessel was melted.

Figure 6:
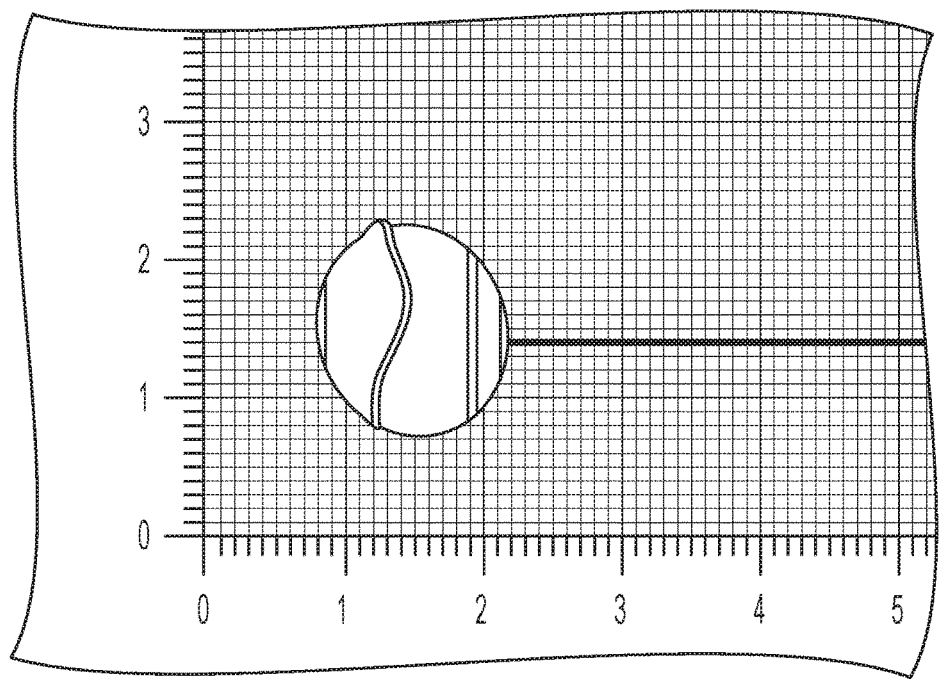
FIG. 6 is a photograph of an appearance of a $Li_{7-x}La_3Zr_{2-x}Ta_xO_{12}$ crystal of Example 4.
Figure 7:
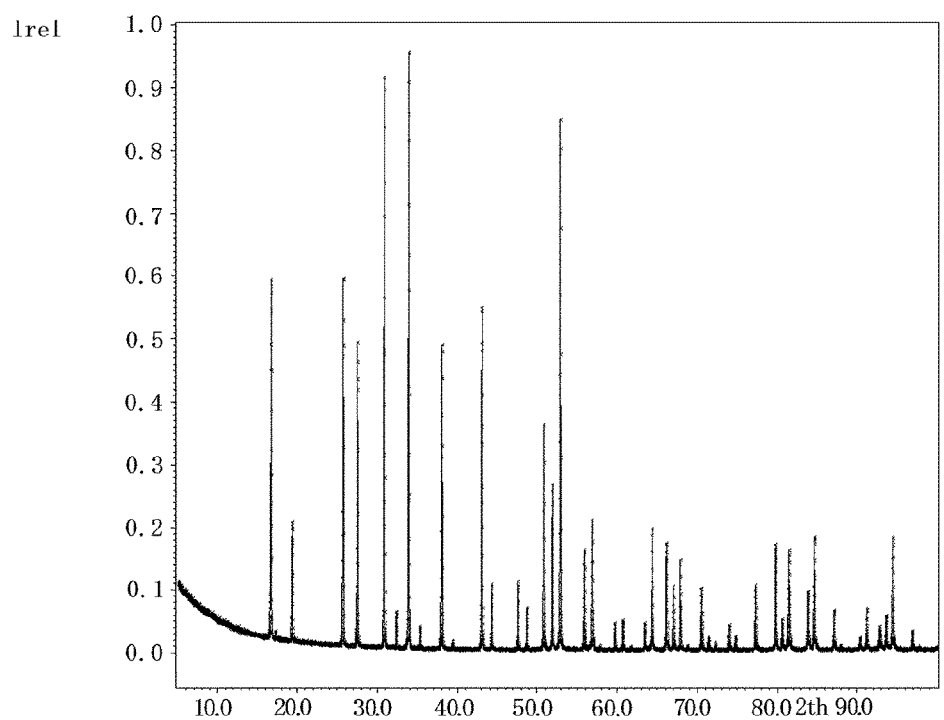
FIG. 7 is a powder X-ray diffraction pattern of the $Li_{7-x}La_3Zr_{2-x}Ta_xO_{12}$ crystal of Example 4.

Then, the tungsten rod was put in a melted zone of the mixed powder while being rotated at 10 rpm in the plane perpendicular to the longitudinal direction, and thereafter lifted at a moving speed of 10 mm/h to thereby grow a $Li_{7-x}La_3Zr_{2-x}Ta_xO_{12}$ crystal. The appearance of the grown $Li_{7-x}La_3Zr_{2-x}Ta_xO_{12}$ crystal (hereinafter, referred to as "Specimen 2" in some cases) is shown in FIG. 6. Further Specimen 2 was crushed and subjected to a powder X-ray diffraction measurement, and the result thereof is shown in FIG. 7.

The powder X-ray diffraction measurement pattern of Specimen 2 was the same as those of cubic garnet-related-structure $Li_{7-x}La_3Zr_{2-x}Ta_xO_{12}$ having so far been reported. The lattice constant a calculated from the result of the powder X-ray structure analysis was a=1.294938±0.000006 nm. Combining the results of the single crystal X-ray diffraction measurement and the powder X-ray structure refinement of the $Li_{7-x}La_3Zr_{2-x}Ta_xO_{12}$ crystal produced by the FZ method and the result of the powder X-ray structure refinement of the $Li_{7-x}La_3Zr_{2-x}Ta_xO_{12}$ crystal produced by the CZ method, the lattice constant a of the $Li_{7-x}La_3Zr_{2-x}Ta_xO_{12}$ crystal was 1.2917 nm a 1.29495 nm.

INDUSTRIAL APPLICABILITY

The high-density lithium-containing garnet crystal according to the present invention can be utilized for a solid electrolyte material of an all-solid-state lithium ion secondary battery, and the like.

The invention claimed is:

1. A lithium-containing garnet crystal, comprising a chemical composition represented by $Li_{7-x}La_3Zr_{2-x}Ta_xO_{12}$, where $0.2 \leq x \leq 1$, a relative density of 99% or higher, belonging to a cubic system, a lattice constant a in which 1.28 nm≤a≤1.30 nm, and a garnet-related structure,
   wherein lithium ions occupy only 96h-sites in a crystal structure of the lithium-containing garnet crystal, and
   the crystal structure contains at least two 96h-sites.

2. The lithium-containing garnet crystal according to claim 1, wherein the lithium-containing garnet crystal has a length of 2 centimeters or longer.

3. The lithium-containing garnet crystal according to claim 1, wherein the lithium-containing garnet crystal has a relative density of 100%.

4. The lithium-containing garnet crystal according to claim 1, wherein the lithium-containing garnet crystal has a lithium ion conductivity of $1.0 \times 10^{-3}$ S/cm or higher.

5. The lithium-containing garnet crystal according to claim 1, wherein the lithium-containing garnet crystal satisfies at least one of the following (1) and (2):
   (1) a Nyquist plot by an alternating current impedance measurement indicates no resistance component by crystal grain boundaries and indicates only a resistance component of a material of the lithium-containing garnet crystal itself; and
   (2) diffraction spots emerge in a diffraction pattern in an X-ray diffraction measurement, a neutron diffraction measurement or an electron diffraction measurement using a single crystal of the lithium-containing garnet crystal.

6. A method for producing the lithium-containing garnet crystal of claim 1 having a chemical composition represented by $Li_{7-x}La_3Zr_{2-x}Ta_xO_{12}$, where $0.2 \leq x \leq 1$, the method comprising:
   melting at least a part of a raw material having a chemical composition represented by $Li_{(7-x)y}La_3Zr_{2-x}Ta_xO_{12}$, where $0.2 \leq x \leq 1$, $1 < y \leq 2$ to thereby form a melted zone; and
   moving the melted zone at a moving speed of 8 mm/h or higher.

7. The method for producing a lithium-containing garnet crystal according to claim 6, wherein the moving speed is 8 mm/h or higher and 19 mm/h or lower.

8. The method for producing a lithium-containing garnet crystal according to claim 6,
   wherein the raw material in a rod-shape is melted while being rotated at a rotating speed of 30 rpm or higher in a plane perpendicular to a longitudinal direction thereof.

9. The method for producing a lithium-containing garnet crystal according to claim 8, wherein the rotating speed is 30 rpm or higher and 60 rpm or lower.

10. An all-solid-state lithium ion secondary battery having a positive electrode, a negative electrode and a solid electrolyte, wherein the solid electrolyte comprises a lithium-containing garnet crystal according to claim 1.

* * * * *